May 21, 1968 JEAN-PIERRE MAYEUR 3,384,832

EXTRA-WIDE BAND SEMI-CONDUCTOR AMPLIFYING DEVICE

Filed Oct. 23, 1964 2 Sheets-Sheet 1

INVENTOR
JEAN-PIERRE MAYEUR

BY Paul M. Craig, Jr.
ATTORNEY

May 21, 1968 JEAN-PIERRE MAYEUR 3,384,832

EXTRA-WIDE BAND SEMI-CONDUCTOR AMPLIFYING DEVICE

Filed Oct. 23, 1964 2 Sheets-Sheet 2

INVENTOR
JEAN-PIERRE MAYEUR
BY Paul M. Craig, Jr.
ATTORNEY 3,384,832
Patented May 21, 1968

3,384,832

EXTRA-WIDE BAND SEMI-CONDUCTOR AMPLIFYING DEVICE

Jean-Pierre Mayeur, 13 Ave. de Wagram, Paris, France

Filed Oct. 23, 1964, Ser. No. 406,030
Claims priority, application France, Oct. 25, 1963, 951,843
17 Claims. (Cl. 330—54)

ABSTRACT OF THE DISCLOSURE

A wide band amplifying device in the form of two transmission lines including active elements and passive elements, means for coupling the transmission lines by current transfer based upon the transistor effect, the lines having in common a connecting line operable to transmit high frequency currents, at least a portion of the connecting line consisting of a semiconductor layer of one of the active elements, the value of the electric characteristics of the passive elements, the dimensions of the active elements and the biasing voltages applied to the active elements being adjusted in such a manner that the velocity of the propagation of a signal along the transmission line is the same, the signal being transmitted by both lines without distortion as a function of the frequency.

This invention relates to a semiconductor amplifying device formed by a line of juxtaposed unit devices, the assembly constituting a linear arrangement having, alike a transmission line, resistance, conductance, capacitance and inductance parameters which are constant with length and presenting a transistor effect, the power amplification between the power dissipated in an input resistance and the power delivered in an output resistance being approximately constant over an extremely wide frequency band ranging from the lowest frequencies up to, for instance, a few thousands of megacycles/s.

As is known, it has been possible to make, in vacuum tube technique, amplifiers capable of particularly wide band operation, the upper limit of which was increased to a few tens of megacycles/s., by building so-called "distributed" amplifiers in which the electric noise parameters of the tube electrodes and connections are integrated within two transmission lines, a grid line and a plate line, cascade-linking several tubes making up "one stage" of a distributed amplifier.

Such an arrangement cannot be used with transistor devices because of the feedback between the collector and the emitter. However, according to a similar conceptual approach, the invention makes it possible to produce a single component, novel in transistor technique, which can make up by itself a structure presenting some of the advantages of a multi-tube distributed amplifier, in particular the extension of the operating range towards the high frequencies, by integrating the electric noise quantities into two transmission lines series-connecting the inputs and outputs of successive amplifying elements.

Figure 1:
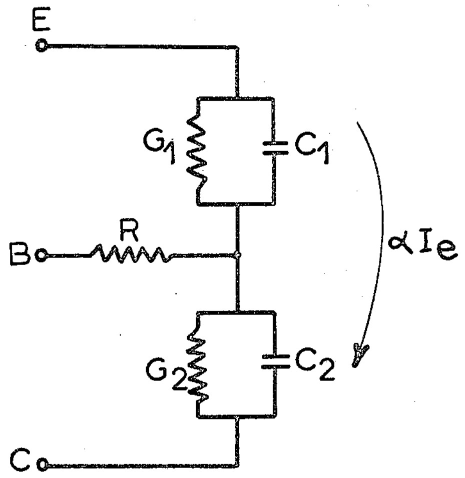
Figure 2A:
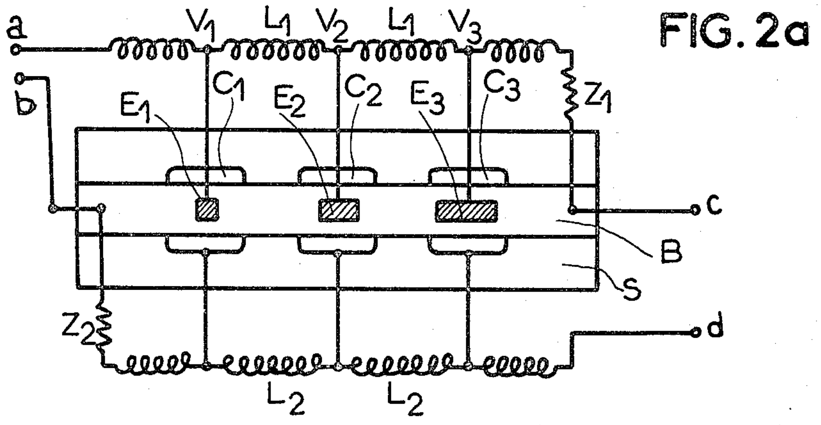
Figure 2B:
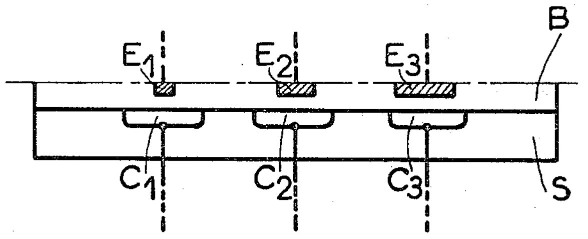
Figure 2C:
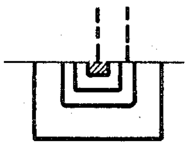
Figure 3A:
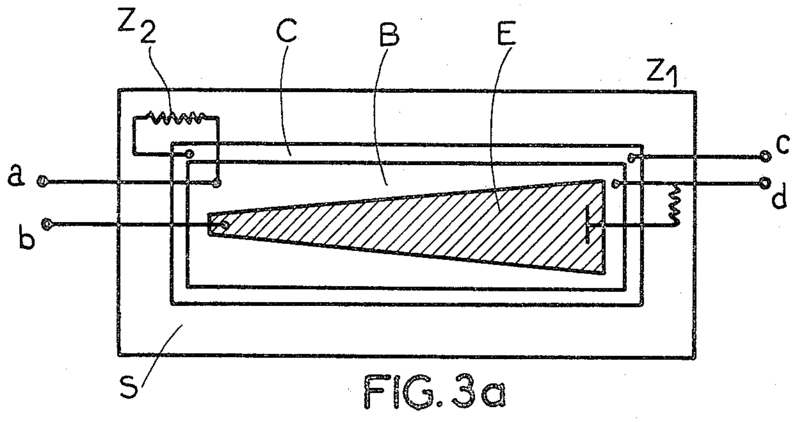
Figure 3B:
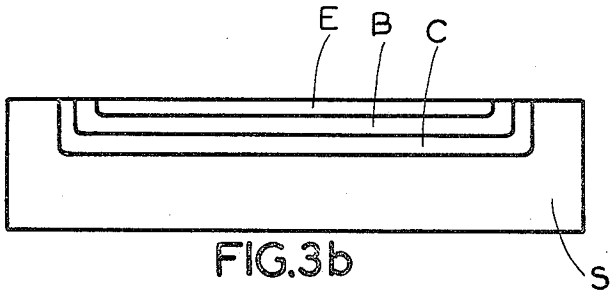
Figure 3C:
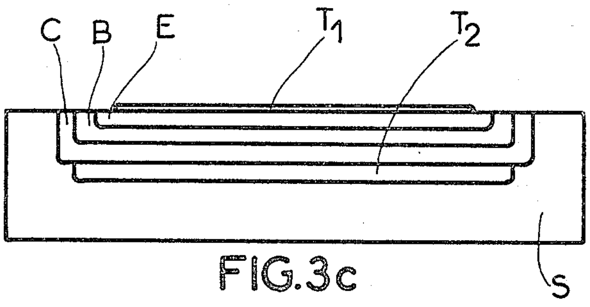

The invention will be described by means of examples with reference to the accompanying drawings amongst which:

FIGURE 1 shows the known equivalent diagram of a transistor;

FIGURES 2*a*, 2*b* and 2*c* illustrate a first intermediate transistor embodiment according to the invention; and FIGURES 3*a*, 3*b* and 3*c* illustrate a distributed parameter transistor according to an improved embodiment of the invention.

FIGURE 1 shows the equivalent diagram of a conventional common base transistor, with an emitter E, a base B, a collector C and comprising a conductance $G_1$ and a capacitance $C_1$ for the emitter-base junction, a conductance $G_2$ and a capacitance $C_2$ for the collector-base junction, a base resistance R, the two dipoles $(RC_1G_1)$ and $RC_2G_2)$ being coupled through the current transfer $\alpha I_e$ due to the transistor effect, where $\alpha$ is the current gain of the transistor with common base.

In a first embodiment, these two dipoles may be considered as forming up a member of a recurring structure made of two T's, in which an elongated common base constitutes the connection line common to all the parallel branches of the two T's, with, on one hand, discrete emitters alined along this base and connected each to the next one by a line of unit inductance L1, and, on the other hand, discrete collectors connected each to the next one by unit inductances L2.

This embodiment is illustrated by FIGURE 2. FIGURE 2*a* is a plan view of such an amplifying structure comprising, for instance, three transistors. S is a semiconductor block, of impurity—free silicium (qualified "intrinsic") for instance, serving as a material support. B is a base common to all three transistors, E1, E2, E3 the emitters of said three transistors, C1, C2, C3 the three corresponding collectors, the emitters being series-connected via inductances L1, the collectors being series-connected via inductances L2, the line of the emitter inductances L1 being terminated by its characteristic impedance Z1, and the line of the collector inductances L2 being terminated by its characteristic impedance Z2. *a*, and *b* are the input terminals, *c* and *d* the output terminals.

In the case of the first embodiment of the invention, the structure admits a propagation of the alternating currents in the base, thus making possible the formation of elementary T members and the achievement of their coupling.

This recurring structure is truly an amplifying one and it shows a gain in power, provided that the characteristic impedance Z2 of the collector line be larger than the characteristic impedance Z1 of the emitter line, since, as is known, the current transfer coefficient $\alpha$ is practically equal to 1.

The amplifying line thus constituted shows, per unit member, a resistance R, an inductance L, a parallel-conductance G and a capacitance C, the subscript 1 referring to the quantities of the emitter line and the subscript 2 referring to the quantities of the collector line, and it is to be noted that $R1=R2=R$, R being the unit resistance of the base. The Heaviside criterion, for undistorted transmission as a function of frequency, as applied to these distributed parameter lines, gives:

$$(1) \qquad L1G1=RC1 \qquad L2G2=RC2$$

Since the propagation of the alternating currents between the emitters must be synchronized with the propagation between the collectors, there is a relation for the equality of the propagation velocities which gives:

$$(2) \qquad L1C1=L2C2$$

In addition, it is known that the characteristic impedances can be expressed as:

$$(3) \qquad Z1=\sqrt{\frac{R}{G_1}} \qquad Z2=\sqrt{\frac{R}{G_2}}$$

The power gain, which is equal to $$\frac{Z_2^2\cdot\alpha I_e}{Z_1^2\cdot I_e}$$

can be taken approximately equal to:

$$\frac{Z_2^2}{Z_1^2}$$

that is, using (3), to $$\frac{G_1}{G_2}$$

The gain is hence larger than unity if $$\frac{G_1}{G_2}$$

is larger than 1, a condition which is, on principle, always fulfilled.

The values of the parameters G1 must be the same for the successive transistors, Nos. 1, 2, 3 . . ., but G1 is the conductance of the emitter-base junction and it is well known that the conductance of an emitter-base junction is an increasing function of the direct current which flows through it: it is approximately proportional to this current. The direct-current voltage V decreasing along the line because of the series resistance, the voltages V1, V2, V3 shown on FIGURE 2*a* will decrease in the direction $V1>V2>V3$. Consequently, in order that the same current flow in the successive emitter junctions, these junctions must be designed with increasing areas. This has been illustratively shown in FIGURES 2*a*, 2*b* and 2*c*.

FIGURE 2*a* is a partially schematic plan view of an amplifying line, with distributed parameters, obtained in this way, where the emitters E1, E2, E3 have an increasing area. FIGURE 2*b* is a longitudinal section and FIGURE 2*c* is a cross-section of the same structure.

The amplifying structure described above may be obtained by the selective local diffusion technique, called the diffusion-passivation technique. For instance, on a piece of intrinsic silicium A, used as an insulating support having no electric purpose, are formed a single base B of N type conduction, emitters of increasing areas in the direction of the amplification and of P type conduction, and collectors of P type conduction.

In this embodiment, the invention leads to the concept of a distributed parameter amplifying line obtained by substituting members of elementary length for the finite length members described above, the parameters *r, l, c, g,* having now the meaning of parameters per unit length. To this effect, and making use of the preceding considerations on the conductance of the emitter junctions, one combines, on a same semiconductor block, of silicium for instance, a collector region of N type conduction for example, a base region of P type conduction and an N type emitter junction having an increasing area between the amplifying line inlet and outlet. FIGURE 3*a* is a plan view and FIGURE 3*b* is a longitudinal section of this structure, the symbols referring to the same elements as similarly designated in FIGURE 2*a*.

It is well known in semiconductor technology that it is possible to adjust the series resistance, the conductance and the junction capacitance values by adequately selecting the impurities concentration, i.e. the "doping," the geometric dimensions and the direct-current biasing. Relations can hence be derived, which give the parameters per unit length *r, g, c* of the lines belonging to the structure of the invention.

The termination impedances Z1, Z2 are preferably integrated into the structure, according to the "integrated circuits" technique, by evaporation of resistant substances (for instance Nichrome).

As for the inductance parameters, the layers making up the transistor according to the invention may also be adjusted as concerns their material characteristics and their geometric dimensions so as to comply with the desired values $l_1$, $l_2$.

In order to achieve this result more easily, the collector layer, on one hand, and the emitter layer, on the other hand, may receive two longitudinal conductive strips covering them respectively, the width and the thickness of which will be selected so as to produce the unit inductance satisfying Equations 1 and 2.

For example, an additional band T2 with a high "doping" (for instance with phosphorus), hence conductive, may be deposited by diffusion under the collector layer C; through the evaporation of a metal such as, for instance, gold or antimony, an additional conductive band T1 may be provided over the emitter E.

FIGURE 3*c* is a schematic longitudinal section of a distributed parameter transistor, showing the support S, the emitter metallic conductive strip T1, the emitter E, the base B, the collector C and the high doping conductive strip T2.

The transistor according to the invention, which eliminates the band-width limitations due to the effect of the junction capacitances and transit times, may cover amplifying ranges from zero to several thousands of megacycles/s.

What I claim is:

1. A solid state, extra-wide band amplifying device of the distributed type comprising active elements and passive elements making up a first and a second transmission line coupled therewith by transistor effect, said lines being grouped in a single compact unit including a common support plate made of intrinsic semiconductor material, an elongated plate of semiconductor material constituting a common base layer of a plurality of transistors, a plurality of emitter layers disposed in a row along said base layer and making up the emitter layers of said transistors, a plurality of collector layers associated with said emitter layers and said base layer, the first transmission line comprising a plurality of passive elements, the emitter layers and the base layer, the second transmission line comprising a plurality of passive elements, the collector layers and said base layer.

2. The device according to claim 1, wherein the junctions between the series of emitter layers and the base layer have an area increasing along the length of the base layer.

3. The device according to claim 2, wherein the value of the electric characteristics of the passive elements, the dimensions of the active elements, and the biasing voltages applied to the active elements are adjusted in such a manner that the velocity of the propagation of a signal along said transmission lines are the same, and that said signal is transmitted in both lines without distortion as a function of the frequency.

4. Extra wide band amplifying device of the distributed type comprising active elements and liaison passive elements making up two parallel lines, said lines being coupled by the active elements, said amplifying device including a series of transistors having each a collector layer provided with a terminal, a base layer, and an emitter layer provided with a terminal, first connecting means for connecting the terminal of the emitter of a first transistor of said plurality of transistors to a first input terminal, second connecting means for connecting a second input terminal with a first point of the base layer of said first transistor, a plurality of third connecting means operatively connecting the terminal of the emitter layer of each transistor of the series with the terminal of the emitter layer of the consecutive transistor of said series, a plurality of fourth connecting means operatively connecting a second point of the base layer of each transistor to a first point of the base layer of a consecutive transistor of said series, a plurality of fifth connecting means operatively connecting the terminal of the collector layer of each transistor with the terminal of the collector layer of the consecutive transistor of said series, the second point of the base layer of the last transistor of said series being connected to a first output terminal, a sixth connecting means operatively connecting the terminal of the collector layer of said last transistor with a second output terminal, a seventh connecting means operatively connecting the terminal of the emitter layer of said last transistor with said first output terminal, and a further connecting means operatively connecting the terminal of the collector layer of said first transistor with said second input terminal.

5. The device according to claim 4, wherein each of said fourth connecting means is made of semiconductor of the same type of conductivity and same nature as the base layer of each transistor, the assembly of said transistors forming a compact unit of transistors having a substantially rectangular common base layer, said emitter layers and the corresponding collector layers being disposed along a substantially straight row.

6. The device according to claim 5, wherein the junction layer between the emitter layer of one of the transistors and the common base layer has an increased area with respect to the area of the corresponding junction of a preceding transistor.

7. The device according to claim 5, wherein the values of the areas of the emitter layers and the values of the electrical characteristics of said first, second, third, fifth, and sixth connecting means have such a relationship that an electric signal is transmitted without distortion as a function of the frequency and at a same velocity in a first transmission line formed by the semiconductor unit, the first, second and third connecting means, and a second transmission line formed by the semiconductor unit, said fifth, sixth connecting means, the seventh and eighth connecting means being the characteristic impedances of said first and second lines.

8. The device according to claim 7, wherein said first, third, fifth and sixth connecting means are inductances.

9. The device according to claim 7, wherein the semiconductor unit includes a support plate of semiconductor material of intrinsic type welded to the collector layers.

10. The device according to claim 8, wherein the semiconductor unit includes a support plate of semiconductor material of instrinsic type welded to the collector layers.

11. The device according to claim 9, wherein said fourth connecting means consist of semiconductor plates of same nature and type of conductivity as said emitter layer, the assembly of said plates and said layers forming a continuous emitter layer, the width of which increases from one of its ends to the other.

12. The device according to claim 9, wherein said fifth connecting means consist of semiconductor plates of same nature and same type of conductivity as said collector layer, the assembly of said plates and said layers forming a continuous collector layer.

13. The device according to claim 11, wherein said emitter layer comprises a longtiudinal strip secured at its outer surface, said strip having as effect to provide a given linear inductance to the compact unit.

14. The device according to claim 12, comprising a longitudinal conductive strip secured between the collector layer and the intrinsic semiconductor support, for providing a given linear inductance to said compact unit.

15. The device according to claim 9, wherein said fourth connecting means consist of semiconductor plates of the same nature and type of conductivity as said emitter layer, the assembly of said plates and said layers forming a continuous emitter layer, the width of which increases from one of its ends to the other, said fifth connecting means consisting of semiconductor plates of the same nature and same type of conductivity as said collector layer, the assembly of said plates and said layers forming a continuous collector layer, said device further comprising longitudinal conductive strips provided along the outer surface of the emitter layer and between the collector layer and the intrinsic semiconductor support.

16. The device according to claim 9, wherein said fourth connecting means consist of semiconductor plates of same nature and type of the conductivity as said emitter layer, the assembly of said plates and said layers forming a continuous emitter layer, the width of which increases from one of its ends to the other, said fifth connecting means consisting of semiconductor plates of the same nature and same type of conductivity as said collector layer, the assembly of said plates and said layers forming a continuous collector layer, said device further comprising longitudinal conductive strips provided along the outer surface of the emitter layer and between the collector layer and the intrinsic semiconductor support, one of said strips comprising a metallic layer obtained by metal evaporation method.

17. The device according to claim 9, wherein said fourth connecting means consist of semiconductor plates of same nature and type of conductivity as said emitter layer, the assembly of said plates and said layers forming a continuous emitter layer, the width of which increases from one of its ends to the other, said fifth connecting means consist of semiconductor plates of same nature and same type of conductivity as said collector layer, the assembly of said plates and said layers forming a continuous collector layer, said device further comprising longitudinal conductive strips provided along the outer surface of the emitter layer and between the collector layer and the intrinsic semiconductor support, one of said strips comprising a layer of a metal selected from the group consisting of gold and antimony.

References Cited

FOREIGN PATENTS 883,740 12/1961 Great Britain.
975,098 11/1964 Great Britain.

ROY LAKE, *Primary Examiner.*

NATHAN KAUFMAN, *Examiner.*

UNITED STATES PATENT OFFICE
CERTIFICATE OF CORRECTION

Patent No. 3,384,832

May 21, 1968

Jean-Pierre Mayeur

It is certified that error appears in the above identified patent and that said Letters Patent are hereby corrected as shown below:

In the heading to the printed specification, lines 4 and 5, "13 Ave. de Wagram, Paris, France" should read -- Paris, France, assignor to Compagnie Generale D'Electricite, Paris, France, a corporation of France --.

Signed and sealed this 16th day of September 1969.

SEAL)

ıttest:

dward M. Fletcher, Jr.

.ttesting Officer

WILLIAM E. SCHUYLER, JR.

Commissioner of Patents